US009066453B2

(12) United States Patent
Wagner et al.

(10) Patent No.: US 9,066,453 B2
(45) Date of Patent: Jun. 23, 2015

(54) POWER ELECTRONIC SYSTEM AND METHOD OF ASSEMBLY

(71) Applicant: Mission Motor Company, San Francisco, CA (US)

(72) Inventors: Jon Wagner, San Francisco, CA (US); Geoff Nichols, San Francisco, CA (US)

(73) Assignee: Mission Motor Company, San Francisco, CA (US)

( * ) Notice: Subject to any disclaimer, the term of this patent is extended or adjusted under 35 U.S.C. 154(b) by 290 days.

(21) Appl. No.: 13/787,581

(22) Filed: Mar. 6, 2013

(65) Prior Publication Data

US 2013/0235527 A1 Sep. 12, 2013

Related U.S. Application Data

(60) Provisional application No. 61/607,348, filed on Mar. 6, 2012.

(51) Int. Cl.
*H05K 7/20* (2006.01)
*H05K 3/30* (2006.01)
*H05K 1/02* (2006.01)
(Continued)

(52) U.S. Cl.
CPC .................. *H05K 7/209* (2013.01); *H05K 3/30* (2013.01); *Y10T 29/4913* (2015.01); *H05K 1/0203* (2013.01); *H05K 2201/1003* (2013.01); *H05K 2201/10371* (2013.01); *H05K 7/20927* (2013.01)

(58) Field of Classification Search
CPC ....... H05K 7/20; H05K 7/2049; H05K 7/209; H05K 7/20927; H05K 7/20872; H05K 7/20127; H05K 3/30; H01L 23/473; H01L 31/048; H01L 35/50; G06F 1/20; G06F 1/206; F28D 15/00; F28D 15/0233; B60L 1/04; B60L 1/14
USPC .......... 361/679.46, 679.53, 679.54, 688, 689, 361/698, 699, 700–712, 715, 719, 361/760–768; 165/80.2, 80.3, 80.4, 80.5, 165/104.19, 104.33, 104.34, 185; 62/259.2; 257/706–727; 174/15.1, 16.3, 252, 174/520; 363/64, 65, 56.02, 141–147, 137; 307/11, 38, 9.1, 10.1, 43, 82, 115
See application file for complete search history.

(56) References Cited

U.S. PATENT DOCUMENTS 5,751,058 A * 5/1998 Matsuki ........................ 257/692
5,966,291 A * 10/1999 Baumel et al. ................ 361/707
(Continued)

FOREIGN PATENT DOCUMENTS

JP 2004072959 A * 3/2004 ............ H01L 23/473

*Primary Examiner* — Michail V Datskovskiy
(74) *Attorney, Agent, or Firm* — Jeffrey Schox; Diana Lin

(57) ABSTRACT

A power electronic system including a casing encapsulating a circuit board and multiple power electronic components mounted to a first broad face of the circuit board. The casing includes a case body, a first lid, and a second lid. The case body includes a cooling channel region including a cooling plate having a first and second broad face, cooling features extending from the cooling plate first broad face, and a cooling block extending from the cooling plate second broad face. The case body further includes a first access gap defined through the case body. The circuit board is mounted to the casing with the first broad face proximal the cooling plate second broad face. The power electronic system additionally includes a connector that extends from the case exterior to connect to the circuit board first broad face, wherein connector connection is facilitated by the first access gap.

27 Claims, 7 Drawing Sheets

(51) Int. Cl.
  *G06F 1/20* (2006.01)
  *F28D 15/00* (2006.01)

(56) References Cited

U.S. PATENT DOCUMENTS

| | | | | |
|---|---|---|---|---|
| 6,156,970 | A * | 12/2000 | Harting et al. | 174/547 |
| 6,166,937 | A * | 12/2000 | Yamamura et al. | 363/141 |
| 6,621,701 | B2 * | 9/2003 | Tamba et al. | 361/699 |
| 6,661,659 | B2 * | 12/2003 | Tamba et al. | 361/699 |
| 7,095,612 | B2 * | 8/2006 | Beihoff et al. | 361/696 |
| 7,187,548 | B2 * | 3/2007 | Meyer et al. | 361/699 |
| 7,579,805 | B2 * | 8/2009 | Saito et al. | 318/800 |
| 7,710,721 | B2 * | 5/2010 | Matsuo et al. | 361/699 |
| 7,710,723 | B2 * | 5/2010 | Korich et al. | 361/699 |
| 7,719,838 | B2 * | 5/2010 | Nakajima et al. | 361/699 |
| 7,742,303 | B2 * | 6/2010 | Azuma et al. | 361/699 |
| 7,965,510 | B2 * | 6/2011 | Suzuki et al. | 361/699 |
| 8,059,404 | B2 * | 11/2011 | Miller et al. | 361/699 |
| 8,064,234 | B2 * | 11/2011 | Tokuyama et al. | 363/141 |
| 8,072,758 | B2 * | 12/2011 | Groppo et al. | 361/703 |
| 8,072,760 | B2 * | 12/2011 | Matsuo et al. | 361/707 |
| 8,240,411 | B2 * | 8/2012 | Nakatsu et al. | 180/65.21 |
| 8,848,370 | B2 * | 9/2014 | Shin et al. | 361/699 |
| 8,902,582 | B2 * | 12/2014 | Yalamanchili et al. | 361/679.54 |
| 2013/0039009 | A1 * | 2/2013 | Shin et al. | 361/699 |

* cited by examiner

POWER ELECTRONIC SYSTEM AND METHOD OF ASSEMBLY

CROSS-REFERENCE TO RELATED APPLICATIONS

This application claims the benefit of U.S. Provisional Application No. 61/607,348 filed 6 Mar. 2012, which is incorporated in its entirety by this reference.

TECHNICAL FIELD

This invention relates generally to the power electronics field, and more specifically to a new and useful power electronic system configuration in the power electronics field.

BACKGROUND

Small form factors are oftentimes desirable for power electronic systems, particularly for on-board systems. However, the electrical and physical configurations of the power electronic components within these small form factors oftentimes lead to thermal management and assembly issues.

Conventionally, power electronic systems for vehicles and other applications employ liquid- or air-based cooling systems to cool the hottest heat-generating components of the power electronic system. However, because these heat-generating components are oftentimes located in various positions within the power electronic system, such cooling systems tend to be inefficient and bulky.

Furthermore, the casing configuration of conventional power electronic systems precludes close-packing of heat-generating components within the system due to assembly difficulties. Conventional power electronic systems typically have a casing with a full bottom that is cast as a singular piece with the case body. This full bottom prevents subsequent access to the side of the circuit board supporting the power electronic components after the circuit board is coupled to the casing. This lack of access precludes assembly methods that require subsequent access to said circuit board side, such as the connection of connector leads to the circuit board.

Therefore, it is desirable to have a power electronic system that enhances the thermal management and manufacturability of the system. This invention provides such new and useful power electronic system.

DESCRIPTION OF THE PREFERRED EMBODIMENTS

The following description of the preferred embodiments of the invention is not intended to limit the invention to these preferred embodiments, but rather to enable any person skilled in the art to make and use this invention.

1. Power Electronic System

Figure 1:
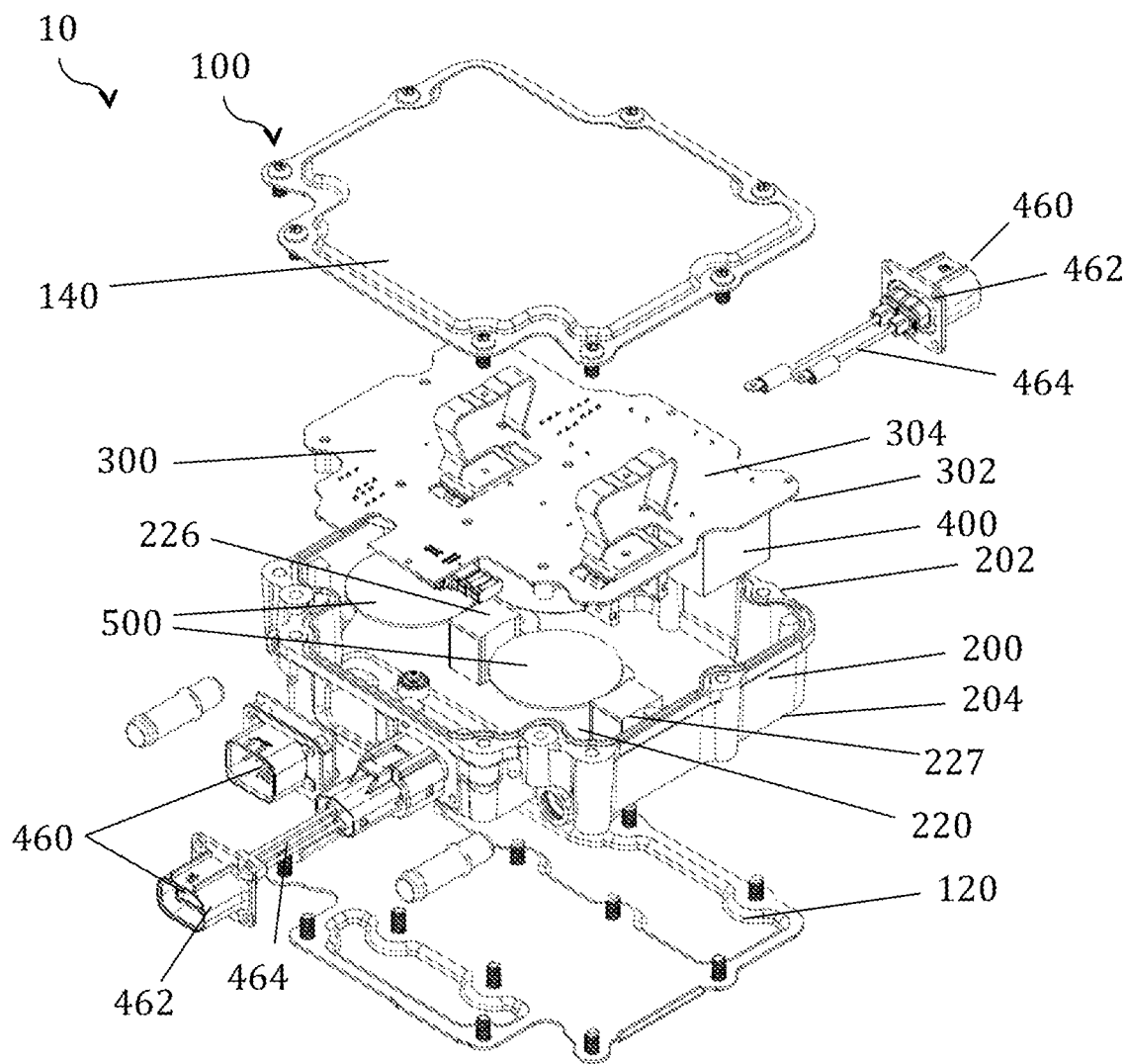
FIG. 1 is an exploded perspective view of the power electronic system.

The power electronic system 10 functions to control and convert electric power. As shown in FIGS. 1, 2 and 3, the power electronic system 10 includes a casing 100 enclosing a circuit board 300. The casing 100 preferably has a case body 200, a first lid 120, and a second lid 140, wherein the case body 200 preferably at least partially defines a cooling channel 220, and a first access gap 240 adjacent the cooling channel 220 that extends through the case body thickness. Components of the power electronic system 10 are preferably mounted to a broad face of the circuit board 300, more preferably to the broad face of the circuit board 300 proximal the cooling channel 220.

This power electronic system 10 confers several benefits over conventional systems. First, this power electronic system 10 allows for more efficient component cooling by collocating the heat-generating components of the power electronic system 10 near the cooling channel 220. This is preferably accomplished by mounting the heat-generating components to the same broad face of the circuit board 300 that is adjacent the cooling channel 220. In one variation of the system, active components and magnetic devices are preferably collocated above and directly thermally connected to the cooling channel 220, while lower heat-generating components, such as capacitors, can be indirectly coupled to the cooling channel 220. Power electronic components (e.g., inductor, transformer, switches, and diodes) can be arranged to achieve the shortest power routing path, resulting in smaller power conduction losses, lower heat generation, and potentially cheaper power connections. Power electronic components can additionally be arranged along the cooling channel 220 according to heat generation, with the highest heat-generating component proximal the coolant inlet 160 and lower heat-generating components proximal the coolant outlet 180. This power electronic system 10 configuration is distinct from conventional power electronic system 10s in that the active components are not only collocated near the passive components, but also extend perpendicularly from the circuit board 300 to couple to a portion of the cooling channel 220, allowing for more efficient active component cooling.

Second, this power electronic system 10 allows for easy assembly while maintaining a small form factor. To achieve a small form factor while maintaining the thermal benefits conferred by the configuration described above, system components that bridge the casing 100 interior and exterior, such as connectors, ideally occupy a space adjacent the power electronic components to take advantage of the system thickness required by the height of the power electronic components. However, in conventional systems, this configuration leads to assembly complications. Conventional systems typically have a casing 100 including a casing bottom manufactured as a singular piece with the case body 200. These integrated casing bottoms prohibit access to the connection pins on the circuit board 300 after the circuit board 300 is coupled to the casing 100, as the connection pins are now fully encapsulated between the casing bottom and the circuit board 300. This system resolves these issues by splitting the casing 100 into a case body 200 that includes an access gap through the body thickness and a first lid 120 that functions as the casing bottom. The access gap is preferably aligned with the connection pins on the circuit board 300, such that the connector leads extend through the first access gap 240 to connect to the connection pins after circuit board assembly to the case body 200. Access gaps can additionally permit power component extension beyond the cooling channel 220 along the casing thickness to accommodate components taller than those coupled to the cooling channel 220. Conventional systems also do not provide a reliable way of thermally coupling the active components to the cooling channel 220 when the active components are located on the same broad face of the circuit board 300 as the passive components. This system is distinct from conventional systems in that it utilizes a retention mechanism 422 that extends from the second broad face 304 of the circuit board 300, through the circuit board thickness, to bias the active components against the cooling block 227 after circuit board assembly to the case body 200. With these features, the power electric system configuration can lead to easier and/or cheaper manufacturing and/or maintenance.

The power electronic components preferably include at least one active component 420 and one passive component 440. Active components (active electronic components) can include semiconductors, such as diodes, transistors, integrated circuits, optoelectronic devices, and switches, discharge devices, display technologies, power sources, or any other suitable electronic component that relies on a source of energy. Passive components (passive electronic components) include magnetic devices such as inductors, transformers, amplifiers, generators, and solenoids, energy storage components such as capacitors, resistive elements, networks such as RC or LC networks, transducers, sensors, detectors, oscillators, display devices, or any other suitable passive component 440. The power electronic system 10 can additionally include electromechanical components or any other suitable power electronic component 400. The power electronic system 10 can additionally include connectors 460 that permit electrical and control access to the power electronic components, such as a power inlet that receives an AC current and a power output that delivers a DC current. The power electronic system 10 can be a battery charger, a discrete inverter, a DC/DC converter, an AC/DC charger, an AC/DC grid tie, an active discharge device, a precharge device, or any other suitable system that converts and controls electric power. The power electronic system 10 is preferably is preferably used within an application that includes a rechargeable battery pack (e.g., on-board a vehicle), but can alternatively be remote from the system (e.g., external the vehicle). The power electronic system 10 is preferably utilized with a vehicle, more preferably an electric or hybrid vehicle, but can alternatively be utilized with a stationary battery backup source, electric or hybrid power equipment, or any other suitable system that requires battery charging.

The casing 100 of the power electronic system 10 functions to define a cooling channel 220 and to house and protect the circuit board 300 and power electronic system components. As shown in FIGS. 1 and 3, the casing 100 preferably includes three pieces: a case body 200, a first lid 120, and a second lid 140, wherein the first and second lids couple to and seal the case body 200. However, the casing 100 can include a case body 200 and only one lid (e.g., wherein the circuit board 300 functions as the second lid 140), a case body 200 and six lids that couple to and seal the case body 200, a case body 200 with a lid and a cooling channel 220-defining plate (e.g. wherein the case bottom is manufactured as a singular piece with the case body 200 and the cooling plate 222 is coupled between the circuit board 300 and the case body 200), or any other suitable case body/lid arrangement.

The lids of the casing 100 function to seal the case body 200. More specifically, the first lid 120 functions to cooperatively define the cooling channel 220 with the case body 200 and to seal a first end of the access gaps. The first lid 120 can additionally function to thermally couple components having a first form factor to the cooling channel 220. The components with the first form factor (primary components) preferably have a broad face (e.g., cooling face) substantially parallel to the circuit board broad face when the component is coupled to the circuit board. Examples of components with the first form factor include passive components such as capacitors, transformers, and inductors. The electrical components with the first form factor preferably extend through an access gap, past the cooling channel 220, to thermally connect to the first lid 120. Alternatively, the electrical components with the first form factor can extend from the circuit board broad face 302 to couple to the cooling plate 222. The second lid 140 functions to mechanically protect the circuit board 300 within the case body 200, and can additionally function to seal a second end of the access gaps. The lids are preferably substantially flat and planar, and preferably share the profile of the case body 200. The first and second lids are preferably mirror images of each other, but can alternatively be different, such as having different cutouts or features. Due to their simplicity, the lids are preferably stamped (e.g., from sheet metal), but can alternatively be cast, sintered, printed, or manufactured with any other suitable process. The lids are preferably metal, such as aluminum, steel, or stainless steel, but can alternatively be any suitable material (e.g., polymer, ceramic, etc.).

The case body 200 of the casing 100 functions to cooperatively define the cooling channel 220 with the first lid 120, functions as a mounting point for the circuit board 300, and functions to mechanically surround and protect the circuit board 300 and power electronic components. The case body 200 preferably includes the majority of the case features. In particular, the case body 200 preferably defines the majority of the cooling channel walls, wherein the first lid 120 preferably only defines one cooling channel wall. The case body 200 preferably additionally defines circuit board mounting points, lid mounting points, circuit board 300 alignment features, connector ports, cooling fluid ports, and any other suitable case feature. The case body 200 preferably additionally defines supplementary cooling features 225, such as cooling blocks that extend from the cooling channel 220 toward the circuit board mounting points. The case body 200 preferably has an asymmetric profile to aid in assembly, but can alternatively have a symmetric profile. Due to its complexity, the case body 200 is preferably cast (e.g., using die casting, permanent mold casting, sand casting, etc.), but can alternatively be machined (e.g., using computer numerical control machines), sintered, printed, or otherwise manufactured. The case body 200 is preferably manufactured as a singular piece, but can alternatively be manufactured as multiple pieces and assembled. The case body 200 is preferably metal, such as aluminum, steel, or copper, but can alternatively be made of a polymer or any other thermally conductive material.

Figure 2A:
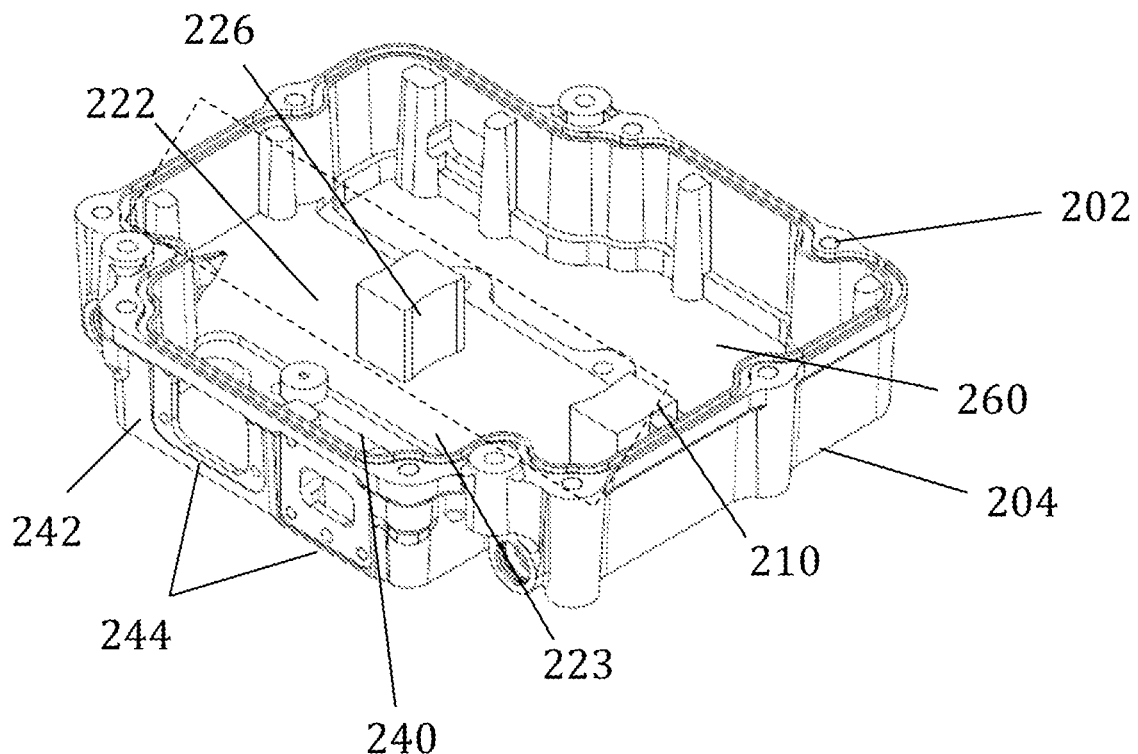
FIGS. 2A and 2B are perspective views of the first and second side of the case body, respectively.
Figure 2B:
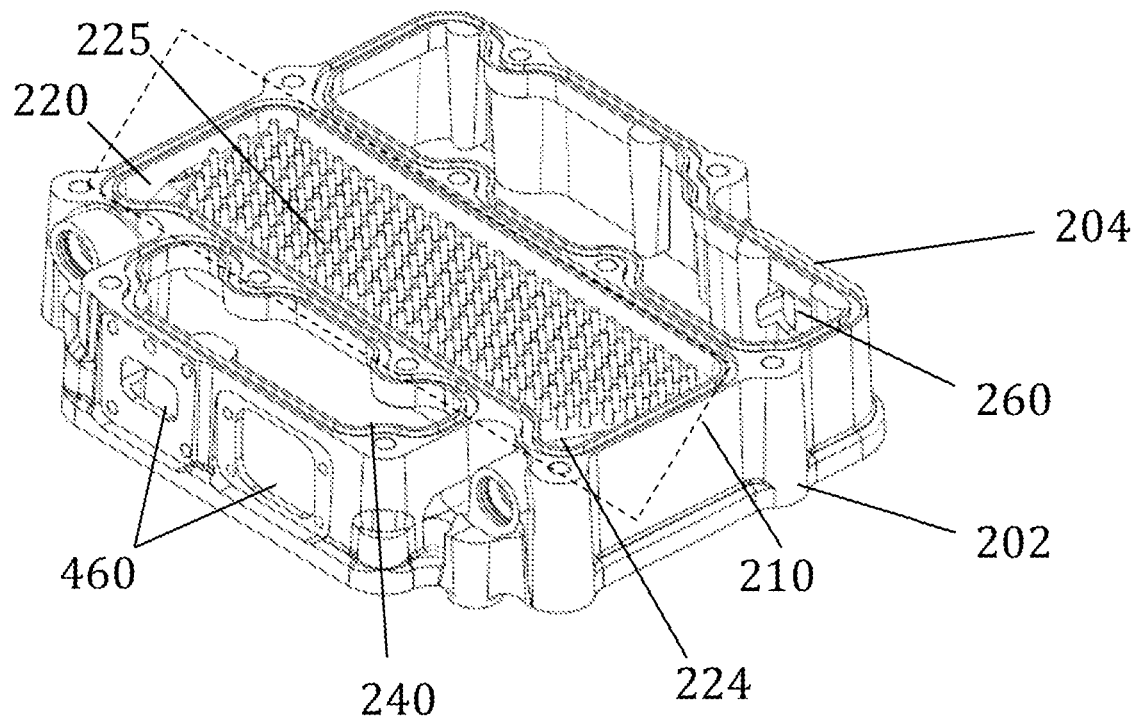
Figure 3:
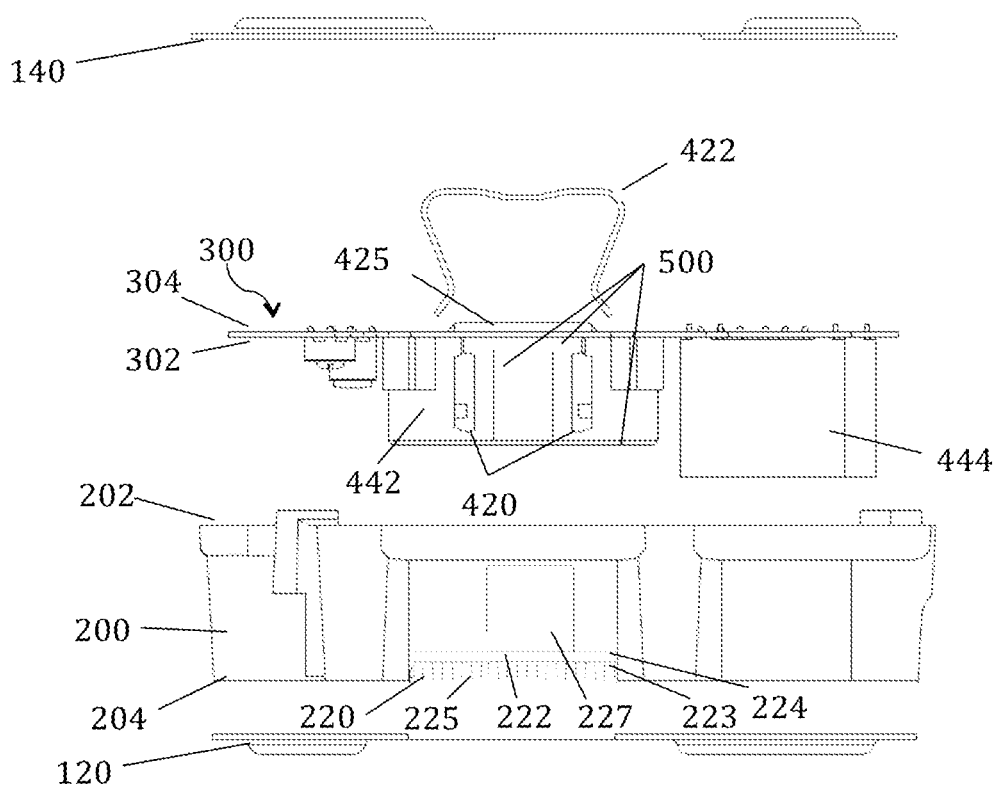
FIG. 3 is and exploded side view of the power electronic system.

As shown in FIGS. 2A and 2B, the case body 200 preferably includes a plurality of case walls enclosing an area and a cooling plate 222 extending between at least two opposing case walls. The case walls are preferably substantially perpendicular to the cooling plate 222, but can alternatively be at an angle. The case walls preferably terminate in a first and second common, imaginary plane on either side of the cooling plate 222 (e.g., the wall edges are level), but can alternatively terminate at any suitable position (e.g., unevenly). The cooling plate 222 is preferably arranged near the middle of the case wall height, but can alternatively be arranged proximal an edge of the case walls. The cooling plate 222 is preferably substantially planar, but can alternatively be curved, stepped, or have any suitable configuration.

The case body 200 preferably defines a cooling channel region 210, a first access gap 240, and a second access gap 260 adjacently arranged along the case width, wherein the cooling channel region 210 is preferably located between the first and second access gaps 260. The cooling channel region 210, first access gap 240, and second access gap 260 preferably have a first, second and third longitudinal axis, respectively, wherein the first, second, and third longitudinal axes are preferably substantially parallel to the longitudinal axis of the case body 200. Alternatively, the first, second, and third longitudinal axes can be substantially parallel to the lateral axis of the case body 200. The cooling channel region 210 and second access gap 260 preferably extend the length of the case, but can alternatively extend a portion of the case length, extend along the case width, or extend along any suitable portion of the casing 100. The first access gap 240 is preferably shorter than and centered along the case length, but can alternatively be any suitable length and offset any suitable amount from the length centerline.

The cooling channel region 210 preferably defines the majority of the cooling channel 220, wherein the cooling channel 220 functions to transfer heat from a heat-generating component to a cooling fluid, thereby facilitating heat removal from the power electronic system 10. The cooling channel 220 is preferably cooperatively defined by the cooling plate 222, which has a first and a second opposing broad face, and the case walls extending from the first broad face 223 of the cooling plate 222. However, the cooling channel 220 can be defined by an insert or be otherwise defined. The cooling channel 220 is configured to receive a cooling fluid through a coolant inlet 160 fluidly coupled to an inlet manifold, and egress heated cooling fluid through a coolant outlet 180 fluidly coupled to an outlet manifold. The cooling fluid is preferably received from a fluid reservoir, but can alternatively be received from a motor cooling system, a motor control cooling system, or any other suitable cooling system utilized by the general system (e.g., vehicle). The cooling fluid is preferably pumped through the power electronic system 10, but can alternatively flow through the power electronic system 10 via hydrostatic force or any other suitable driving force. The cooling fluid is preferably a water-glycerol mixture (e.g., a 50/50 mixture), but can alternatively be water, refrigerant, air, or any suitable fluid that transfers heat.

As shown in FIG. 2B, the cooling channel 220 is preferably fluidly isolated from the adjacent first and second access gap 260s by auxiliary walls extending from the cooling plate 222, wherein the auxiliary walls preferably also define the cooling channel 220. The auxiliary walls preferably extend from the cooling channel 220 face of the cooling plate 222, and preferably terminate at the imaginary common plane shared by the case walls. The cooling channel region 210 preferably includes two auxiliary walls, wherein the cooling channel 220 is defined between said auxiliary walls and a portion of two adjacent case walls. In one variation, the adjacent case walls oppose each other, and are perpendicular to the auxiliary walls. The ends (e.g. face perpendicular to the broad face) of the walls defining the cooling channel 220 preferably include a substantially continuous groove that function to receive a complimentary gasket, which functions to form a substantially fluid-impermeable seal with the first lid 120 to prevent coolant leakage.

The cooling channel region 210 also preferably includes an inlet and outlet manifold port that fluidly couple to an inlet 160 and an outlet 180, respectively. The inlet and outlet manifold ports are preferably located on a wall, more preferably an auxiliary wall but alternatively a case wall. Alternatively, the inlet and outlet manifold ports can be located on different walls. The cooling channel region 210 preferably includes one inlet manifold port and one outlet manifold port, but can alternatively include multiple inlet or outlet manifold ports located in various positions. In one variation, the inlet and outlet manifold port are located through the auxiliary wall 242 proximal or defining the first access gap 240. In one alternative of the variation, the inlet and outlet manifold ports are located on either side of the connector ports. The inlet and outlet manifold ports are preferably configured to receive an inlet and outlet barb, respectively.

The cooling channel 220 is preferably a single, straight channel, but can alternatively be a plurality of channels (e.g., parallel or boustrophedonic, with parallel or cross flows), a single boustrophedonic channel, or any other suitable configuration. As shown in FIG. 2B, the cooling channel 220 can additionally include cooling features 225 within the cooling channel 220 that function to facilitate heat transfer between the heat-generating components and the cooling fluid by increasing the available surface area for heat transfer. The cooling features 225 preferably extend from the first broad face 223 of the cooling plate 222, distal the circuit board 300, but can alternatively extend from a first broad face of the second lid 140 proximal the circuit board 300, extend from the case walls defining the cooling channel 220, or extend from any other suitable portion of the case body 200. The cooling features 225 can include a plurality of tubes (e.g. hollow or solid) in a matrix or random distribution, a plurality of fins extending along the cooling channel 220 longitudinal axis, wherein the fins can be straight, bent, serpentine 423, or have any suitable pattern, or include any other suitable features that increase the area of thermal exchange. The cooling features 225 preferably extend perpendicularly from the supporting wall (e.g. the first broad face 223 of the cooling plate 222), but can alternatively extend at an angle between flat and normal from the supporting wall. The cooling features 225 are preferably manufactured as a singular piece with the case body 200, but can alternatively be manufactured as a separate piece and inserted into the cooling channel 220.

As shown in FIG. 2A, the cooling plate 222 can additionally include a component-coupling feature 226 that thermally couples the cooling channel 220 to the power electronic components extending from the circuit board 300. The component-coupling feature 226 preferably has a substantially constant thickness in a dimension parallel to the second broad face 224 of the cooling plate 222 to facilitate uniform casing 100 of the case body 200, but can alternatively have any other suitable dimension. The component-coupling feature 226 is preferably manufactured as a singular piece with the case body 200, but can alternatively be manufactured as a separate piece and subsequently thermally coupled to the case body 200.

Figure 4:
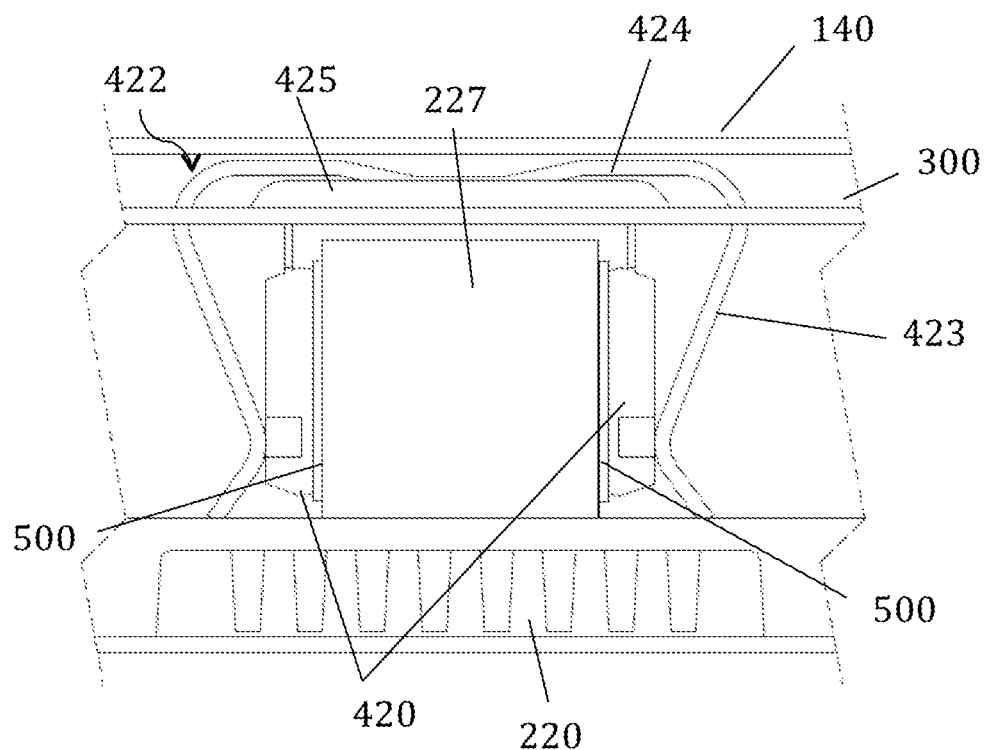
FIG. 4 is a side view of a variation of a component-coupling feature coupled to a power electronic component.

As shown in FIG. 4, the component-coupling feature 226 preferably extends perpendicularly from the second broad face 224 of the cooling plate 222, but can alternatively extend at any suitable angle. The component-coupling feature 226 preferably couple to a broad face of the power electronic component 400, but can alternatively couple to an arcuate portion of the power electronic component 400, to an end of the power electronic component 400 parallel to the second broad face 224 of the cooling plate 222, or to any other suitable portion of the power electronic component 400. The component-coupling feature 226 preferably couples to an electronic component 400 having a second form factor (secondary components) to the cooling channel 220. The components with the second form factor preferably have a broad face (e.g., cooling face) substantially perpendicular or at an angle (e.g., between perpendicular and parallel) to the circuit board broad face 302 when the component is coupled to the circuit board 300. The secondary components are preferably shorter than the thickness of the casing, and are preferably as tall as or shorter than the distance between the cooling plate and the second lid. Secondary components can be active or passive. Examples of secondary components include TO-247 components, or any other component having a second form factor. The component-coupling feature 226 is preferably a cooling block 227 that extends from the second broad face 224 of the cooling plate 222, but can alternatively be a cooling rod that extends from the second broad face 224 of the cooling plate 222 through the center of a circular power electronic component 400 or any other suitable component-coupling feature 226. The cooling block 227 preferably includes a flat coupling surface (e.g. broad coupling surface of the cooling block 227) that couples along a broad face of the power electronic component 400. The power electronic component 400 is preferably biased against the flat coupling surface by a retention mechanism 422, but can alternatively be biased against the flat coupling surface by the connection between the power electronic component 400 and the circuit board 300, by a displacement of adjacent power electronic components, or by any other suitable means. The retention mechanism 422 preferably extends through the circuit board thickness from the second broad face 304 of the circuit board 300 to bias the power electronic component 400 against the flat coupling surface of the cooling block 227. In one variation of the system, the retention mechanism 422 includes a clip with two tines 423 extending from an intermediary portion 424, wherein the tines 423 extend through two complimentary holes in the circuit board 300 to bias the power electronic component 400 against the flat coupling surface and the intermediary portion 424 braces against the second broad face 304 of the circuit board 300 to retain the tine position relative to the circuit board 300. The distance between the complimentary holes is preferably substantially equal to the width of the cooling block 227, but can alternatively be different. The second broad face 304 of the circuit board 300 preferably includes an insulator (e.g. clip insulator 425), located between the holes, that electrically and/or thermally insulates the intermediary portion 424 from the circuit board 300. The retention mechanism 422 is preferably thermally and electrically insulated or non-conductive, but can alternatively be made of any suitable material. The cooling block 227 can additionally be thermally coupled to a power electronic component 400 adjacent the active component 420. In one example, the cooling block 227 can thermally couple to the arcuate surface of an inductor or transformer. To this end, the cooling block 227 preferably includes concave sides having a complimentary curvature to the arcuate surface (as shown in FIG. 2A). In one variation of the system, the cooling block 227 includes a first and second opposing flat coupling surface, with a first and second pocketed side (e.g. concave, angled, etc.) connecting the first and second flat coupling surfaces. The power electronic system 10 preferably includes one cooling block for each pair of active components, but can alternatively include one cooling block for each active component 420, one cooling block for multiple active components, or any other suitable number of cooling blocks. The cooling blocks are preferably arranged with the flat coupling surfaces parallel to the longitudinal axis of the cooling channel 220, but can be otherwise arranged. The interface between the cooling block 227 and the power electronic component 400 preferably additionally includes a thermal interface 500 that facilitates increased thermal transfer and thermal contact between the power electronic component 400 and the cooling block 227. The thermal interface 500 can include thermal pads (heat-conductive pads), thermal compound/thermal grease (e.g., ceramic based, metal based, carbon based, phase change metal alloy [PCMA], etc.), metal plating (e.g., a copper plate), or any other suitable thermal interface. The thermal interface 500 is preferably bonded to the cooling block 227, the power electronic component 400, or both, but can alternatively be compressed between the two elements.

Figure 5:
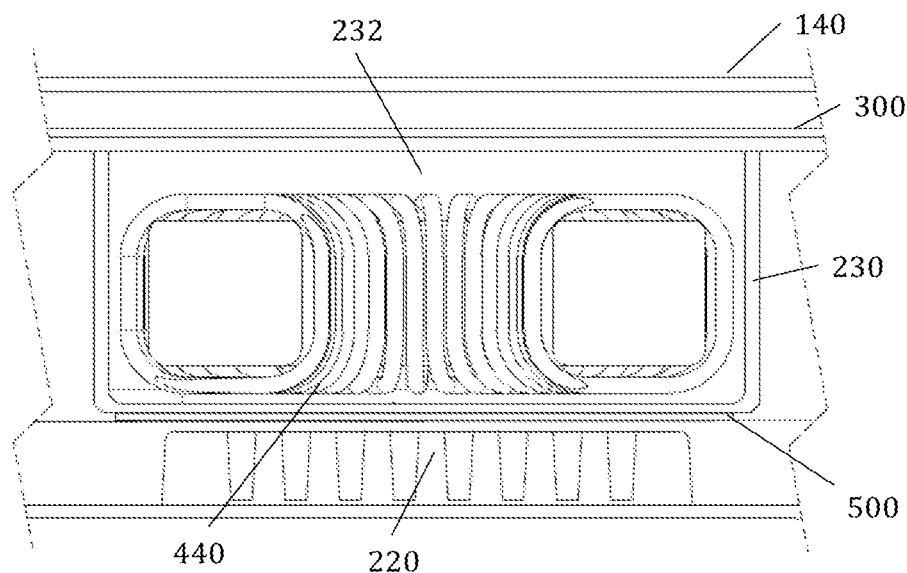
FIG. 5 is a side view of a cooling receptacle cooperatively encapsulating a power electronic component with the circuit board.

As shown in FIG. 5, the cooling channel region 210 can additionally include a cooling receptacle 230 that encapsulates and thermally connects a power electronic component 400 with the cooling channel 220. The power electronic component 400 enclosed within the cooling receptacle 230 is preferably a passive component 440, more preferably a magnetic device 442 such as a transformer or inductor, but can alternatively be any suitable power electronic component 400. The cooling receptacle 230 preferably cooperatively encloses the power electronic component 400 with the circuit board 300, but can alternatively entirely enclose the power electronic component 400. The cooling receptacle 230 preferably thermally couples the primary component to the second broad face 224 of the cooling plate 222, but can alternatively thermally couple to the first lid 120, the cooling block 227, or to any other suitable component thermally connected to the cooling channel 220. The cooling receptacle 230 is preferably compressed against the cooling plate 222 by the force applied by the mounted circuit board 300, but can be otherwise coupled to the cooling channel 220. The cooling receptacle profile preferably traces the profile of the power electronic component 400, but can alternatively have a different profile. For example, the cooling receptacle 230 can be a hollow cylinder with an open end that encloses a transformer or an inductor. The cooling receptacle 230 is preferably thermally conductive and electrically insulative (e.g. be made of metal with an electrical insulator between the cooling receptacle 230 and the circuit board 300), but can alternatively be made of any suitable material. The cooling receptacle 230 is preferably manufactured as a separate component from the case body 200, and is preferably assembled to the circuit board 300 prior to circuit board assembly to the case body 200. However, the cooling receptacle 230 can be manufactured as a singular piece with the case body 200, or as a separate piece from the case body 200 that is assembled to the case body 200 prior to circuit board mounting. The power electronic system 10 preferably includes a cooling receptacle 230 for each magnetic device 442, but can alternatively include a cooling receptacle 230 for each primary power electronic component or any other suitable number of cooling receptacles. The interface between the cooling receptacle 230 and the cooling plate 222 preferably additionally includes a thermal interface 500 that facilitates increased thermal transfer and thermal contact between the cooling receptacle 230 and the cooling plate 222. The thermal interface 500 can include thermal pads (heat-conductive pads), encapsulation compound/thermal grease (e.g., ceramic based, metal based, carbon based, phase change metal alloy [PCMA], etc.), metal plating (e.g., a copper plate), or any other suitable thermal interface. The thermal interface 500 is preferably bonded to the cooling receptacle 230, the cooling plate 222, or both, but can alternatively be compressed between the two elements.

The cooling receptacle 230 preferably additionally encloses an encapsulation compound 232 that facilitates heat transfer between the enclosed power electronic component 400 and the cooling receptacle 230. The encapsulation compound 232 preferably substantially encapsulates or encases the entirety of the power electronic component 400, but can alternatively encase a portion of the component. The encapsulation compound 232 is preferably thermally conductive, electrically insulative, and magnetically inert. The encapsulation compound 232 can be a solid, liquid, gel, or have any other suitable phase. Example encapsulation compound 232s include epoxy, silicone based potting compound, coolant (e.g., water/glycerol mixture, water, refrigerant, polyalkylene glycol, oils, liquid fusible alloys, etc.), thermal grease, or any other suitable encapsulation material. The encapsulation compound 232 is preferably introduced into the cooling receptacle 230 prior to circuit board coupling, but can alternatively be introduced after.

As shown in FIGS. 1 and 2, the access gap functions to provide access to connection pins and/or power electronic components on the circuit board 300 after the circuit board 300 is mounted to the case body 200. The access gaps are preferably holes defined through the thickness of the case body 200, more preferably holes defined through the thickness of the cold plate but alternatively holes defined between the cold plate edge and a case wall. The case body 200 preferably defines a first and a second access gap 260, wherein the first access gap 240 preferably opposes the second access gap 260 across the cooling channel region 210 but can alternatively be otherwise arranged. However, the case body 200 can include any suitable number of access gaps.

The first access gap 240 is preferably configured to provide access to connector pins on the first side of the circuit board 300 (mounted proximal the first side 202 of the case body 200) from the side of the case body 200 distal the circuit board 300 (second side 204 of the case body 200). The first access gap 240 preferably additionally includes connector ports that extend through a case wall defining the first access gap 240, preferably the case wall 242 having a normal axis perpendicular the longitudinal axis of the first access gap 240 but alternatively any other suitable wall. The connector ports can be aligned with the cooling channel 220 (e.g. a plane extending through the cooling channel 220 would intersect the connector ports), but can be offset from the cooling channel 220 (e.g. adjacent the first side 202 of the case body 200, proximal the circuit board mounting points). In one variation of the system, the coolant inlet 160 and coolant outlet 180 are preferably located adjacent to or on said wall, such that all external connections are located on a single side. However, the coolant inlet 160 and outlet 180 can alternatively be located in any suitable location. The first access gap 240 preferably includes two connector ports (e.g. for a power inlet connector and a signal connector), but can include any suitable number of ports. The first access gap 240 preferably also includes a hole though the cooling plate thickness, through which the AC power inlet and signal connector can couple to the circuit board 300.

The second access gap 260 is preferably configured to permit power electronic component extension therethrough. More preferably, the second access gap 260 is configured to allow capacitor extension from the first face of the circuit board 300, through the thickness of the case body 200, past the cooling channel 220, to thermally couple to the second lid 140. The second access gap 260 can additionally include a power output port through a case wall. In one variation, the power output port extends through a longitudinal case wall. Alternatively, the second access gap 260 can be located within the cooling channel region 210, wherein the capacitors are thermally coupled to the cooling plate 222.

Figure 6:
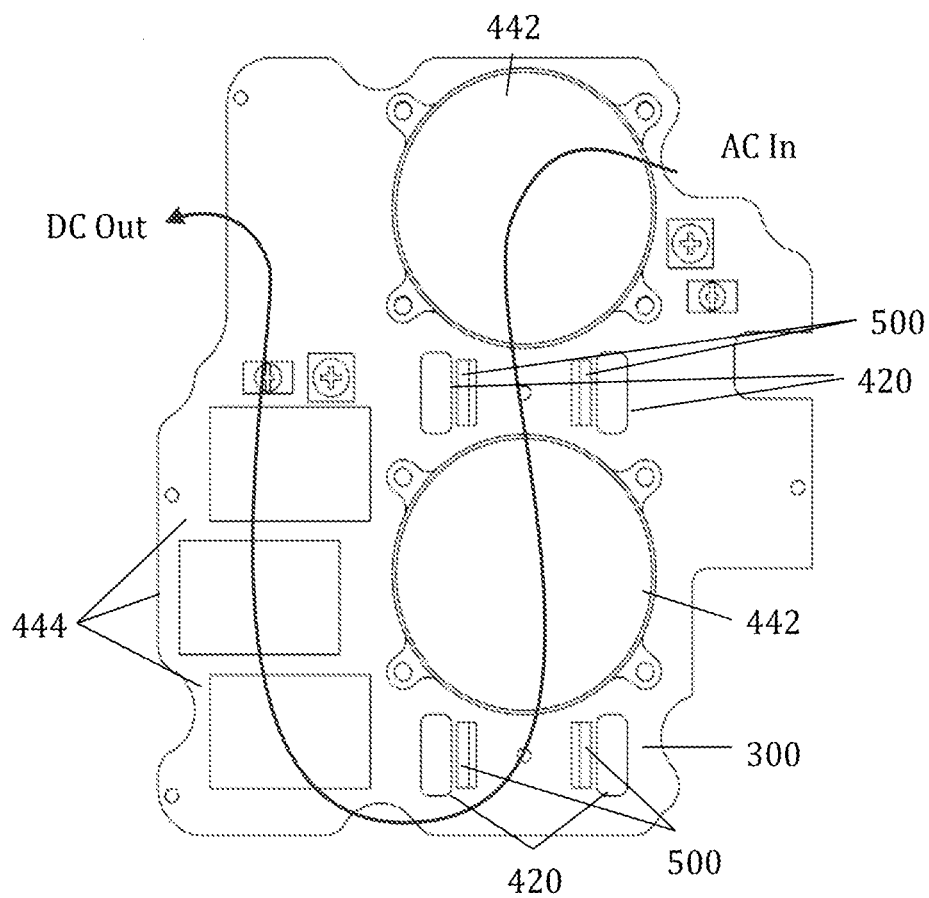
FIG. 6 is a schematic representation of a power transfer path through a variation of the power electronic system.

The circuit board 300 functions to manage electric power control and conversion, and functions to mechanically support the power electronic components. The circuit board 300 preferably determines the power parameters (e.g., rate of power provision, amount of power, etc.) based on external information. For example, when the power electronic system 10 is a battery charger, the circuit board 300 determines the power parameters that should be provided to the battery pack based on battery pack information received from the battery pack. Battery pack information received by the circuit board 300 can include the battery pack(s) state of charge, voltage, current, resistivity, or any other suitable parameter indicative of battery pack power requirements. The circuit board 300 can also determine the suitable rate of power supply based on the current supplied by the AC power source. This current can be determined from a current sensor (e.g., a Hall effect loop sensing circuit board 300 or shunt resistor current sensor) coupled about the AC input connector pin, any other suitable current measurement device, or any other parameter indicative of power supply current. The circuit board 300 also functions to route current/power from the power inlet to the power outlet. In one variation of the power electronic system, as shown in FIG. 6, the circuit board 300 routes AC current from the power supply through an inductor, a switch, a transformer, a pair of diodes, and a capacitor to transform the AC current into DC current. In one alternative of the variation, the inductor is arranged proximate the power inlet, the switch arranged proximal the inductor, the transformer arranged proximal the switch, the diodes arranged proximal the transformer, and the capacitor arranged alongside the switch, transformer, and diode. In this alternative, the inductor, switch, transformer, and diodes are preferably aligned along the case width. This alternative can result in a short power routing path between consecutive power electronic components, allowing for smaller power conduction losses and more efficient power conversion. However, any other suitable configuration can be used. The circuit board 300 preferably shares the profile of the case, and preferably includes mounting points through which the circuit board 300 can be coupled to the case walls. The circuit board 300 is preferably coupled to the case walls by screws, but can alternatively be coupled through clips, adhesive, or any other suitable mechanism. The circuit board 300 can additionally include through-holes adjacent the mounting points for the secondary power electronic components that receive the tines 423 of a coupling clip therethrough.

When the power electronic system 10 is a battery charger, the circuit board 300 preferably includes at least an inductor, a transformer, a switch, a diode, and a capacitor, but can alternatively include any suitable number of these components. When the power electronic system 10 is an inverter, the circuit board 300 preferably includes a switch, a capacitor, and a transformer, but can alternatively include any other suitable component. When the power electronic system 10 is a DC/DC converter, the circuit board 300 preferably includes an inductor or transformer, a switch, a diode, and a capacitor, but can alternatively include any other suitable component. When the power electronic system 10 is an AC/DC charger, the circuit board 300 preferably includes an inductor, a transformer, a switch, a diode, and a capacitor, but can alternatively include any other suitable component. When the power electronic system 10 is an AC/DC grid tie, the circuit board 300 preferably includes a transformer, a switch, a diode, and a capacitor, but can alternatively include any other suitable component. When the power electronic system 10 is an active discharge device, the circuit board 300 preferably includes a switch or relay, high power resistors and a fuse, but can alternatively include any other suitable component. When the power electronic system 10 is a precharge device, the circuit board 300 preferably includes a switch or relay and high power resistors, but can alternatively include any other suitable component. However, the circuit board 300 can include any suitable number of any suitable components in any suitable configuration. The power electronic components, more preferably the magnetic devices and secondary components (e.g., active components), are preferably aligned with the cooling channel region 210 when the circuit board 300 is mounted to the case body 200, but can be located elsewhere. The energy storage components (e.g. capacitors) can additionally be aligned with the cooling channel region 210, but are preferably aligned with the second access gap 260 due to their larger height and lower requirement for cooling. The magnetic devices and secondary components are preferably aligned within the cooling channel region 210. In one variation, the longitudinal axes of the magnetic devices (e.g. the diameter of the inductor and transformer) are preferably aligned with the longitudinal axis of the cooling channel 220, and the lateral axis of the secondary components are preferably parallel to the longitudinal axis of the cooling channel 220. When the secondary components are paired (e.g. a pair of diodes or a pair of switches), the lateral axes of the secondary components in the pair are preferably equidistant from the longitudinal axis of the cooling channel 220. The power electronic components are preferably arranged to have the shortest electrical routing path, but can alternatively have any suitable arrangement. The power electronic components are preferably arranged with the highest heat-generating component adjacent the coolant inlet 160, more preferably with the highest heat-generating component adjacent the coolant inlet 160 and the lowest heat-generating component adjacent the coolant inlet 160, but can have any other suitable configuration.

The inductor of the power electronic system 10 functions to store energy in a magnetic field. More specifically, the inductor stores energy received from the AC power supply. The inductor is preferably a ferromagnetic core inductor (e.g., a laminated core inductor, ferrite-core inductor, etc.), but can alternatively be an air core inductor or any suitable inductor. The inductor is preferably located near the power inlet, and as such located near the power inlet port of the case body 200 when the power electronic system 10 is assembled. The inductor is preferably surface mounted onto the circuit board 300, and can be soldered onto the circuit board 300 using reflow, wave soldering, hand soldering, or any other suitable mounting process. In an assembled unit, the inductor is preferably thermally coupled to a cooling receptacle 230. More preferably, the inductor is enclosed between a cooling cylinder and the circuit board 300, wherein the inductor is immersed within an encapsulation compound 232 that thermally couples the inductor to the cooling cylinder. In one example, the cooling cylinder forms a cup that couples to the circuit board 300 to encapsulate the inductor. The cooling receptacle 230 (e.g., cooling cylinder) is preferably thermally coupled to the cooling plate 222, which, in turn, is thermally coupled to the cooling channel 220. The cooling receptacle 230 preferably additionally includes a thermal interface material between the cooling plate 222 and the cooling receptacle 230. However, the inductor can be otherwise thermally coupled to the cooling channel 220 using any other suitable means.

The transformer of the power electronic system 10 functions to transfer energy from the inductor to the load (e.g., battery pack). The transformer can additionally adjust the voltage of the power supplied (e.g., step up or step down the voltage of the provided power). The transformer is preferably a toroidal transformer, but can alternatively be a laminated core transformer, an autotransformer, a ferrite core transformer, or any other suitable transformer. The transformer is preferably surface mounted onto the circuit board 300, and can be soldered onto the circuit board 300 using reflow, wave soldering, hand soldering, or any other suitable mounting process. The transformer is preferably located near the inductor on the same broad face of the circuit board 300. In one variation, the transformer is aligned with the inductor along the width of the case. In an alternative of the variation, the transformer is located proximal the signal input port of the case. In an assembled unit, the transformer is preferably thermally coupled to a cooling receptacle 230. More preferably, the transformer is enclosed between a cooling cylinder and the circuit board 300, wherein the transformer is immersed within an encapsulation compound 232 that thermally couples the transformer to the cooling cylinder. The cooling receptacle 230 (e.g., cooling cylinder) is preferably thermally coupled to the cooling plate 222, which, in turn, is thermally coupled to the cooling channel 220. The cooling receptacle 230 preferably additionally includes a thermal interface material between the cooling plate 222 and the cooling receptacle 230. However, the transformer can be otherwise thermally coupled to the cooling channel 220 using any other suitable means.

The switch of the power electronic system 10 functions to control power transfer between the inductor and the transformer. The switch is preferably controlled by the circuit board 300, but can alternatively be responsive to other signals (e.g., those generated remote from the power electronic system 10). The switch is preferably an electronic switch, and preferably includes two MosFET switching devices placed back to back, but can alternatively be an insulated gate bipolar transistor, an analog switch, a solid-state relay (e.g., silicon-controlled rectifier or triac) or any suitable transistor. The switch is preferably through hole mounted to the circuit board 300 on the same face as the transformer and inductor, and can be soldered onto the circuit board 300 using reflow, wave soldering, hand soldering, or any other suitable mounting process. The switch is preferably mounted at an angle to the circuit board 300, such that it extends from the circuit board broad surface. This configuration reduces the switch footprint on the circuit board 300, allowing for a smaller power electronic system 10 form factor, and facilitates more efficient switch cooling as well as simplified assembly process. In one variation, the switch extends substantially perpendicularly from the circuit board 300. In a second variation, the angle between the switch and circuit board 300 is acute (e.g., substantially more than 0° but less than 90°), such that the switch appears splayed out relative to a normal vector to the circuit board 300. In a third variation, a broad face of the switch is coupled to the circuit board 300, such that the switch lies substantially flat against the circuit board 300. The power electronic system 10 preferably includes two switches, but can alternatively include any suitable number of switches. In one variation, the switches are arranged adjacent each other, and are mounted to the circuit board 300 such that they are splayed out. In an alternative of this variation, the switches are arranged between the transformer and the inductor. In one adaptation of this alternative, the switches are arranged on either side of an imaginary line extending through the center of the transformer, wherein the switches are located equidistant from said line. However, the switches can be arranged in any other suitable configuration/location. The switch is preferably coupled to the cooling channel 220 through a cooling block 227 extending from the broad face of the cooling plate 222. In one variation, a broad face of the switch is compressed against a broad, flat side of the cooling block 227 by the tine 423 of a clip. The switch can additionally include a thermal interface between the switch and cooling block 227. In a second variation, the cooling block 227 is coupled to the acute side of the switch, such that the switch-circuit board connection compresses the switch against the cooling block 227. In a third variation, the cooling block 227 extends just short of the distance between the cooling plate 222 and the circuit board 300 to couple to a broad face of the switch. This variation is preferably utilized with the third variation of the switch-circuit board configuration. In a fourth variation, the switch is coupled along two broad faces to a cooling block 227, wherein the cooling block 227 includes a groove substantially the same dimensions as the switch. In a fifth variation, the switch is coupled along each broad faces to a first and second cooling block 227, respectively, wherein the cooling blocks are compressed against the switch broad faces by a clip. In one example, the power electronic system 10 includes two switches mounted almost perpendicularly to the circuit board 300, wherein the two switches are coupled to a cooling block 227 by a clip, inserted through the circuit board 300, that slides over the switches and compresses the broad faces of the switches against opposing flat sides of the cooling block 227. However, the switch can be coupled to the cooling channel 220 in any other suitable manner, such as being immersed in a heat-transfer fluid.

The diode of the power electronic system 10 functions to rectify the AC current into DC current suitable for the battery pack. The diode is preferably a junction diode (e.g., a p-n junction diode), but can alternatively be a point-contact diode or any other suitable diode. The diode can alternatively be a rectifier including a plurality of diodes (e.g., a bridge rectifier). The diode is preferably through hole mounted to the circuit board 300 on the same face as the transformer and inductor, and can be soldered onto the circuit board 300 using reflow, wave soldering, hand soldering, or any other suitable mounting process. The diode is preferably mounted at an angle to the circuit board 300, such that it extends from the circuit board broad surface. This configuration reduces the diode footprint on the circuit board 300, allowing for a smaller power electronic system 10 form factor, and facilitates more efficient diode cooling as well as simplified assembly process. In one variation, the diode extends substantially perpendicularly from the circuit board 300. In a second variation, the angle between the diode and circuit board 300 is acute (e.g., substantially more than 0° but less than 90°), such that the diode appears splayed out relative to a normal vector to the circuit board 300. In a third variation, a broad face of the diode is coupled to the circuit board 300, such that the diode lies substantially flat against the circuit board 300. The power electronic system 10 preferably includes two diodes, but can alternatively include any suitable number of diodes. In one variation, the diodes are arranged adjacent each other, and are mounted to the circuit board 300 such that they are splayed out. In an alternative of this variation, the diodes are arranged adjacent the transformer opposing the inductor. In one adaptation of this alternative, the diodes are arranged on either side of an imaginary line extending through the center of the transformer, wherein the diodes are located equidistant from said line. However, the diodes can be arranged in any other suitable configuration/location. The diode is preferably coupled to the cooling channel 220 through a cooling block 227 extending from the broad face of the cooling plate 222. In one variation, a broad face of the diode is compressed against a broad, flat side of the cooling block 227 by the tine 423 of a clip. The diode can additionally include a thermal interface between the diode face and cooling block 227. In a second variation, the cooling block 227 is coupled to the side of the diode that forms an acute angle with the circuit board 300, such that the diode-circuit board connection compresses the diode against the cooling block 227. In a third variation, the cooling block 227 extends just short of the distance between the cooling plate 222 and the circuit board 300 to couple to a broad face of the diode. This variation is preferably utilized with the third variation of the diode-circuit board configuration. In a fourth variation, the diode is coupled along two broad faces to a cooling block 227, wherein the cooling block 227 includes a groove substantially the same dimensions as the diode. In a fifth variation, the diode is coupled along each broad faces to a first and second cooling block 227, respectively, wherein the cooling blocks are compressed against the diode broad faces by a clip. In one example, the power electronic system 10 includes two diodes mounted almost perpendicularly to the circuit board 300, wherein the two diodes are coupled to a cooling block 227 by a clip, inserted through the circuit board 300, that slides over the diodes and compresses the broad faces of the diodes against opposing flat sides of the cooling block 227. However, the diode(s) can be coupled to the cooling channel 220 in any other suitable manner, such as being immersed in a heat-transfer fluid.

The energy storage component 444 of the power electronic system 10 functions to control the magnitude of the charging current. The energy storage component 444 is preferably a capacitor but can alternatively be any suitable energy storage component 444. In operation, the capacitor receives power from the diode and outputs a charging current from the power output. The charging ripple voltage properties can be controlled by selecting or adjusting the number and capacitance of the capacitors. In one example, the power electronic system 10 includes three 47 µF capacitors, coupled in parallel, to achieve a charging ripple voltage of 1V. Alternatively, any suitable number of capacitors with any capacitance can be utilized. The capacitor is preferably a ceramic capacitor, but can alternatively be a polycarbonate capacitor, polymer capacitor, polyester capacitor, electrolytic capacitor, double-layer capacitor or any other suitable capacitor. When multiple capacitors are included, the capacitors are preferably of the same type but can alternatively be different. The capacitor(s) is preferably through-hole mounted onto the first side of the circuit board 300, and can be soldered onto the circuit board 300 using reflow, wave soldering, hand soldering, or any other suitable mounting process. The capacitor(s) preferably extends through the second access gap 260 of the casing 100, adjacent the transformer and diodes. In one variation, the capacitor is preferably arranged such that a centerline through the capacitor runs substantially parallel to a centerline through the transformer and/or diode. However, the capacitor can be arranged in any other suitable configuration. When multiple capacitors are used, the capacitor most proximal the diode is preferably the first to receive the transformed power, and the capacitor most distal the diode is preferably the last to receive the transformed power. In one variation, the capacitor most distal the diode is preferably adjacent the power output. The energy storage component(s) is preferably cooled through contact with the first lid 120 of the case, wherein the first lid 120 transfers energy storage component 444-generated heat to the cooling channel 220 that the first lid 120 cooperatively forms with the case body 200. The energy storage component(s) can additionally be cooled through contact with the sidewall of the cooling channel 220. The energy storage component 444 preferably extends through the second access gap 260 to access the first lid 120. The energy storage component 444 preferably directly thermally couples to the first lid 120, but can alternatively be encased within a cooling receptacle 230 that thermally couples to the first lid 120. The energy storage component 444-lid interface can additionally include a thermal interface to facilitate efficient heat transfer. Alternatively, the energy storage component(s) can be cooled in a manner similar to the diode and/or switch, wherein the energy storage component(s) are compressed against a cooling block 227 that extends from the cooling plate 222 by a clip. The energy storage component(s) can also extend the height between the circuit board 300 and cooling plate 222, such that the energy storage component(s) is cooled through the cooling plate 222. The energy storage components can alternatively be cooled through radiation and/or convection and not directly coupled to an element coupled to the cooling channel 220. The energy storage components can alternatively be exposed to the external environment, wherein the first lid 120 includes a through-hole in the second access gap 260 of the case. However, the energy storage components can be cooled in any other suitable manner, or not be cooled at all.

The circuit board 300 additionally includes one or more connector pins that function to connect to a connector 460. The connector pins preferably extend from the first broad face 302 of the circuit board 300 and are configured to align with the first access gap 240 of the case body 200 (e.g. along a longitudinal edge of the circuit board 300 opposing the capacitors across the magnetic devices and secondary components, such as active components), but can alternatively extend from any other suitable portion of the circuit board 300. The connectors preferably include a connector body 462 and a lead that electrically connects the connector body 462 to the connector pin. The connector body 462 is preferably configured to extend from the case exterior to the case interior. The connector body 462 is preferably inserted through a connector port 244 defined in the casing wall defining the first access gap 240. The connector lead 464 is preferably led through the first access gap 240 to connect to the connector pins, but can alternatively not extend through the first access gap 240 to connect to the connector pins (e.g. when the connector port 244 is offset from the cooling channel 220). In the latter case, the first access gap 240 functions to provide access (e.g. for fingers) to connect the leads to the pins. The power electronic system 10 can include power inlets, power outlets, data connections, or any other suitable connector 460, depending on the type of power electronic system 10. For example, a battery charger preferably includes a power inlet and a power outlet, and can additionally include a signal connector 460.

The power inlet of the power electronic system 10 functions to couple the power electronic system 10 with a power source, sink, or other electronic system. As shown in FIG. 1, the power inlet preferably includes a keyed connector 460 surrounding an input connector pin, wherein the connector pin is electrically coupled to the inductor. The connector pin is preferably coupled to the inductor through a lead in the circuit board 300, but can alternatively be coupled through a bus or any other suitable electrical connection. The power inlet is preferably configured to accept a standard power plug, but can alternatively be a standard power plug, a banana plug, a spring pin, or any suitable connector 460. The power inlet is preferably assembled through the power inlet port of the first access gap 240 of the case body 200. The power inlet can additionally include a current sensor that functions to measure the input current received from the power source. The current sensor is preferably a shunt resistor current sensor arranged in series with the power input. The shunt current sensor is preferably located on the circuit board 300. In an alternate embodiment, the current sensor is a Hall effect loop sensing circuit board 300, and surrounds the input connector pin. The Hall effect loop sensing circuit board 300 current sensor is assembled between the case body 200 and the power inlet body.

The power output of the power electronic system 10 functions to couple the power electronic system 10 to the battery pack. As shown in FIG. 1, the power output preferably includes a keyed connector 460 surrounding an output connector pin, wherein the output connector pin is electrically coupled to a capacitor. The connector pin is preferably coupled to the capacitor through a lead in the circuit board 300, but can alternatively be coupled through a bus or any other suitable electrical connection. The power output is preferably configured to accept a standard power plug, but can alternatively be a standard power plug, a banana plug, a spring pin, or any suitable connector 460. The power output is preferably assembled through the power output port of the second access gap 260 of the case body 200. The power output can additionally include a current sensor that functions to measure the output current received from the power source. The current sensor is preferably a shunt resistor current sensor arranged in series with the power output. The shunt current sensor is preferably located on the circuit board 300. In an alternate embodiment, the current sensor is a Hall effect loop sensing circuit board 300, and surrounds the output connector pin. The Hall effect loop sensing circuit board 300 current sensor is assembled between the case body 200 and the power output body.

The power electronic system 10 can additionally include a signal connector 460 that communicates data between a remote portion of the general system and the power electronic system 10. In one variation, the signal connector 460 communicates data between the controller area network bus (CAN bus) and the power electronic system 10 circuit board 300. In a second variation, the signal connector 460 communicates data between the battery pack and the power electronic system 10 circuit board 300. The data received by the signal connector 460 can include commands from other portions of the general system (e.g., vehicle), data indicative of general system performance, data indicative of battery pack state, data indicative of battery pack performance, or any other data relevant for power electronic system 10 operation. Data sent through the signal connector 460 by the power electronic system 10 can include the power transfer rate, power electronic system 10 temperature, duration of power electronic system 10 operation, or any other data indicative of power electronic system 10 operation and/or performance. The signal connector 460 can additionally include a signal circuit, which can function to process the received data into summary data, parcel out instructions sent from remote systems, or perform any other suitable auxiliary function. The signal connector 460 preferably couples to the circuit board 300 through the signal connector port 244 in a wall of the first access gap 240 of the case body 200, but can alternatively couple to the circuit board 300 in any suitable region of the case body 200 (e.g., the second access gap 260). In one variation, the signal connector 460 couples to the circuit board 300 substantially near the switches.

Figure 7:
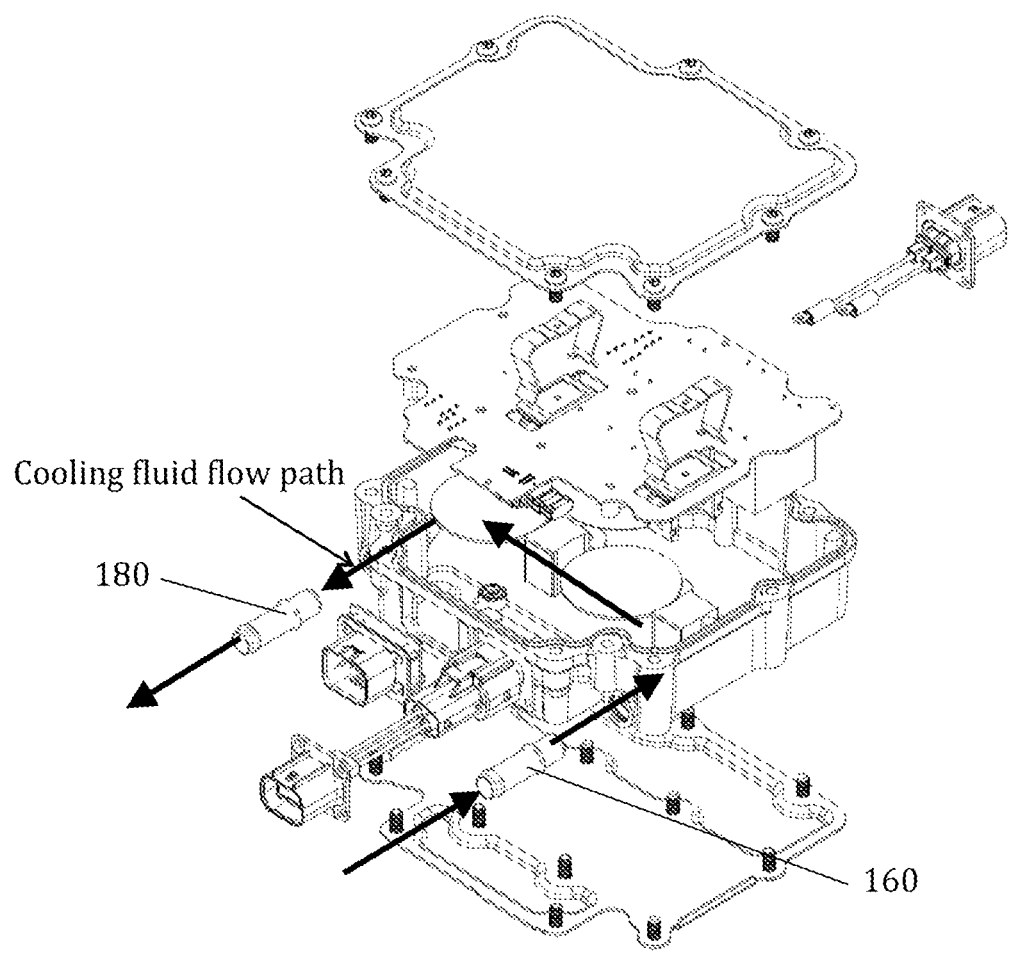
FIG. 7 is a schematic representation of a cooling fluid flow path through a variation of the power electronic system.

In operation, heat generated by the power electronic components directly coupled to the cooling channel 220 (e.g. the magnetic devices and secondary components, such as the inductor, transistor, switches, and diodes) are transferred through the cooling features 225 of the cooling plate 222 to the cooling channel 220, wherein cooling fluid flow through the cooling channel 220 removes said heat. As shown in FIG. 7, the cooling fluid preferably flows into the case through the inlet manifold, through the cooling channel 220, and out of the case through the outlet manifold. However, the cooling fluid can have any suitable flow path dependent on the number, orientation, and configuration of inlet manifolds, outlet manifolds, and cooling channel 220s. In one example, heat from the inductor and/or transistor are transferred: from the magnetic devices to their respective cooling receptacles through encapsulating compound; from the cooling receptacles to the cold plate through thermal interfaces; from the cold plate to the cooling fluid (flowing through the cooling channel 220) through the broad face of the cold plate and the cooling features 225 of the cold plate extending into the cooling channel 220 (e.g., a grid array of cylindrical pins extending from the cold plate broad face). The heat is removed from the system when the cooling fluid flows out of the cooling channel 220. In a second example, heat from the secondary component is transferred: from the secondary component 420 to a cooling block 227 extending from the cooling plate 222 through a thermal interface; and from the cooling block 227/cooling plate 222 to the cooling fluid through the broad face of the cooling plate 222 (defining a portion of the cooling channel 220) and cooling features 225 extending from the cooling plate 222 broad face (e.g., a plurality of fins extending perpendicularly from the broad face). The heat is removed from the system when the cooling fluid flows out of the cooling channel 220. In a third example, heat is transferred from the energy storage component 444 (e.g. capacitor): through a thermal interface to a first lid 120; from the first lid 120 (which defines a wall of the cooling channel 220) to the cooling fluid through the broad face of the first lid 120. The first lid 120 can additionally include cooling features 225, similar to those of the cooling plate 222, that increase lid surface area and thus, heat transfer efficiency. In a fourth example, heat from the capacitor is transferred to the cooling fluid through the cooling plate 222 (e.g., through direct contact with the cooling plate 222 or through a thermal interface), or transferred to the cooling fluid through a cooling block 227 coupled to the cooling plate 222. In a fifth example, heat from the capacitor is transferred to the cooling fluid through the sidewall defining the cooling channel 220. In a sixth example, heat from the power electronic components is removed from the power electronic system 10 by a combination of the first, second, and third examples as previously described. However, heat from the heat-generating components can be removed with any suitable combination of the above, or with any other suitable configuration or means.

2. Assembly Method

Figure 8:
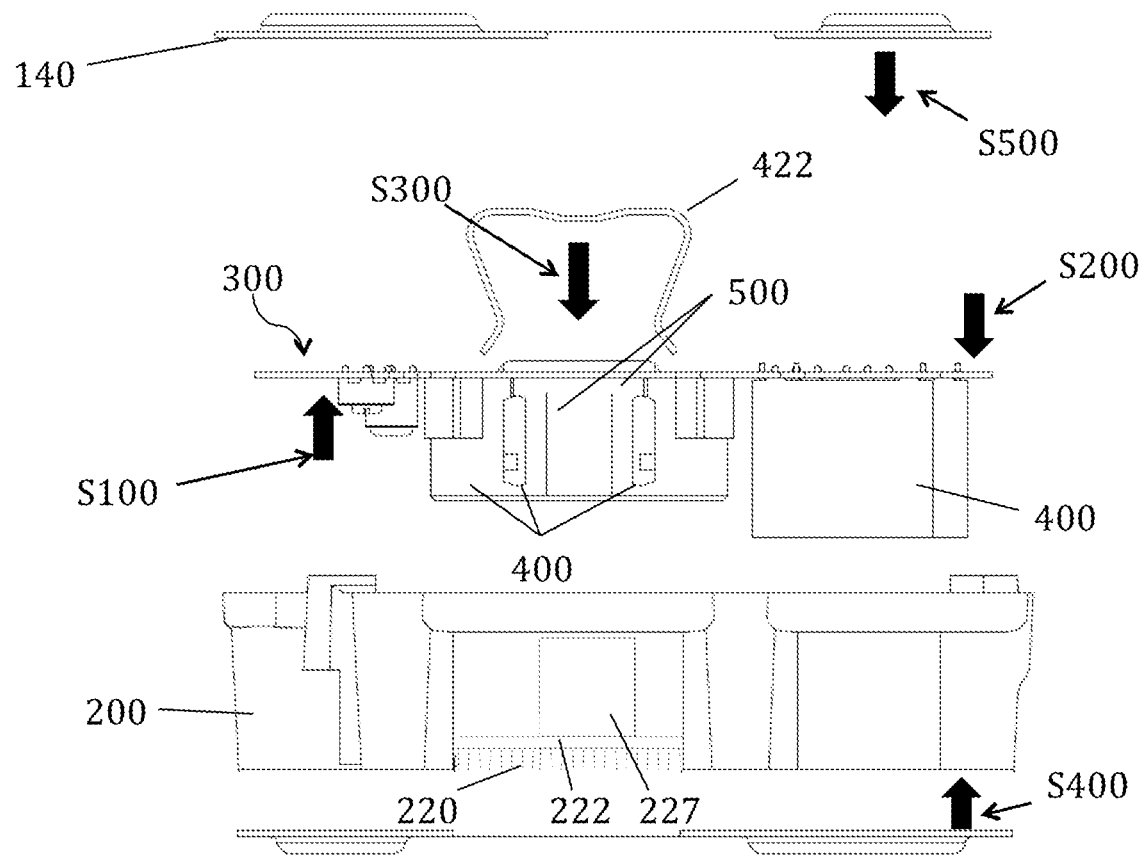
FIG. 8 is a schematic representation of a power electronic system assembly method.

As shown in FIG. 8, the power electronic system assembly method includes assembling power electronic system components to the circuit board S100, mounting the circuit board to the case body S200, thermally coupling the power electronic system components to the cooling channel S300, coupling the first lid to the case body S400, and coupling the second lid to the case body S500. The method can additionally include the step of coupling the second lid to the case body. The power electronic system is preferably assembled with a top-down assembly, such that the second lid is coupled to the case body last, but can alternatively be assembled in any suitable manner.

Mounting the power electronic system components to the circuit board S100 functions to electrically and mechanically couple the power electronic system components to the circuit board. The power electronic components are preferably all mounted to the first broad face of the circuit board, but can alternatively be mounted to different broad faces. The power electronic system components to be mounted can include one or more active components (e.g. switch, diode, etc.), passive components such as magnetic devices (e.g. inductor, transformer, etc.) and energy storage components (e.g. capacitor), or any other suitable power electronic component. The components are preferably mounted by reflow, wherein a BGA is used, but can alternatively be mounted using any suitable mounting method, as described above. The components are preferably mounted to the circuit board with solder, such as lead, tin, or gold solder. The components are preferably all mounted on the same broad face/side of the circuit board. The components are preferably primary components or secondary components. Primary components preferably have a first form factor, wherein the first form factor preferably has a broad face (e.g., cooling face) substantially parallel to the circuit board broad face when the power electronic component is coupled to the circuit board. Secondary components preferably have a second form factor, wherein the second form factor preferably has a broad face (e.g., cooling face) substantially perpendicular or at an angle (e.g., between perpendicular and parallel) to the circuit board broad face when the component is coupled to the circuit board. The primary power electronic components are preferably mounted with a broad face facing the circuit board broad face or with a plane encompassing a major dimension of the component substantially parallel to the circuit board broad face. The secondary components are preferably mounted at an angle to the circuit board broad face, such that a broad face of the secondary components is at an angle to the circuit board broad face. To accomplish this, the leads of the secondary components can be bent at an angle (e.g., between 0° and 90°) before mounting to the circuit board, or the angular position of the secondary components can be retained at the desired position during the mounting process (e.g., with a brace or guide). When the secondary components are paired, the angle formed between the respective secondary components preferably form an obtuse angle, but can alternatively have an acute angle or any other suitable angle.

Mounting the circuit board to the case body S200 functions to couple the circuit board to the case. The circuit board perimeter is preferably coupled to the case walls, but the circuit board can alternatively be coupled through the active area of the circuit board to any suitable portion of the case body and/or lid. The circuit board is preferably screwed into the case body, but can alternatively be clipped, adhered, or otherwise coupled to the case body. Alternatively, the circuit board is coupled to the case body by compression applied by the second lid, wherein mounting the second lid onto the case body compresses the circuit board perimeter against the case walls. A gasket or standoff is preferably provided between the circuit board and case body and/or second lid to prevent circuit board shorting to the case. The gasket, if used, is preferably positioned at least partially within a groove running along the edge of the case wall. Standoffs, if used, are preferably provided around the coupling mechanism (e.g., around a screw body).

Thermally coupling the power electronic system components to the cooling channel S300 functions to establish thermal paths between the power electronic system components and the cooling channel.

Component thermal coupling preferably includes thermally connecting a secondary component to a cooling block S320.

Figure 9:
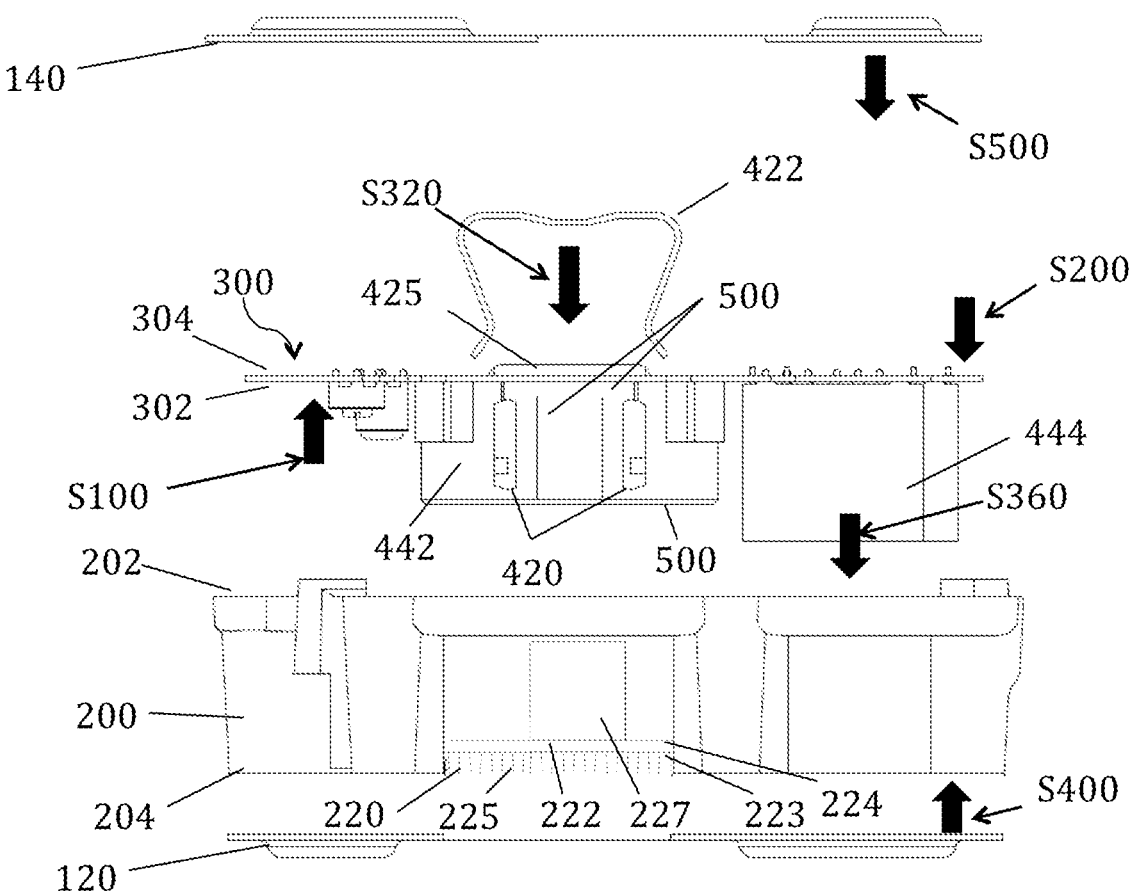
FIG. 9 is a schematic representation of a variation of the power electronic assembly method.

As shown in FIG. 9, thermally connecting a secondary component to a cooling block S320 preferably includes positioning the secondary component next to a planar face of the cooling block when the circuit board is coupled to the case body. A clip is subsequently slid through a clip hole in the circuit board, wherein a clip tine slides over the secondary component face distal from the cooling block and compresses the secondary component against the cooling block face. A portion of the circuit board preferably retains the clip position. The first alternative can additionally include coupling an electrical insulator to the clip, which can function to protect secondary component leads on the circuit board. This is preferably accomplished by providing an electrically insulated clip, but can alternatively be accomplished by placing an electrically insulative material on the clip-retaining portion of the second broad face of the circuit board before the clip is slid through the clip hole.

Alternatively, the secondary component is thermally coupled to a cooling block by coupling the circuit board to the case body, wherein the secondary component is angled toward the cooling block. In this alternative, the spring force of the active component contact preferably provides the compressive force required to achieve sufficient contact between the secondary component face and the cooling block.

Thermally connecting a secondary component to a cooling block S320 can additionally include applying a thermal interface to the secondary component face proximal the cooling block prior to circuit board-case coupling. The thermal interface is preferably adhered to the secondary component face, but can alternatively be adhered to the cooling block face, clipped to the secondary component face, extruded along the lower edge of the secondary component face (wherein coupling with the cooling block distributes the thermal interface), or utilize any other suitable method of applying the thermal interface.

Component thermal coupling to the circuit board S300 preferably additionally includes thermally coupling a cooling receptacle to a primary power electronic component S340, preferably to a passive component, more preferably to a magnetic device. The cooling receptacle is preferably thermally conductive, and is preferably filled with a thermally conductive, electrically insulative, and magnetically inert encapsulation compound that transfers heat from the encapsulated electronic component to the cooling receptacle. The cooling receptacle is configured to couple against the cooling plate, and can additionally couple against the cooling block.

The power electronic component is preferably pre-encapsulated within the cooling receptacle, wherein the cooling receptacle is preferably mounted (e.g., screwed, clipped, adhered) to the circuit board when the power electronic component is mounted to the circuit board, prior to circuit board coupling to the case body. This can be particularly desirable if the encapsulation compound is a solid, but can alternatively be used with a substantially fluid encapsulation compound, wherein the encapsulation compound is introduced into the cooling receptacle after coupling with the circuit board. The cooling receptacle is preferably thermally coupled to the cooling channel when the circuit board is mounted to the case body. Thermal coupling of the power electronic component to the cooling channel can additionally include applying a layer of thermal interface material to a cooling receptacle face adjacent the cooling channel.

Figure 10:
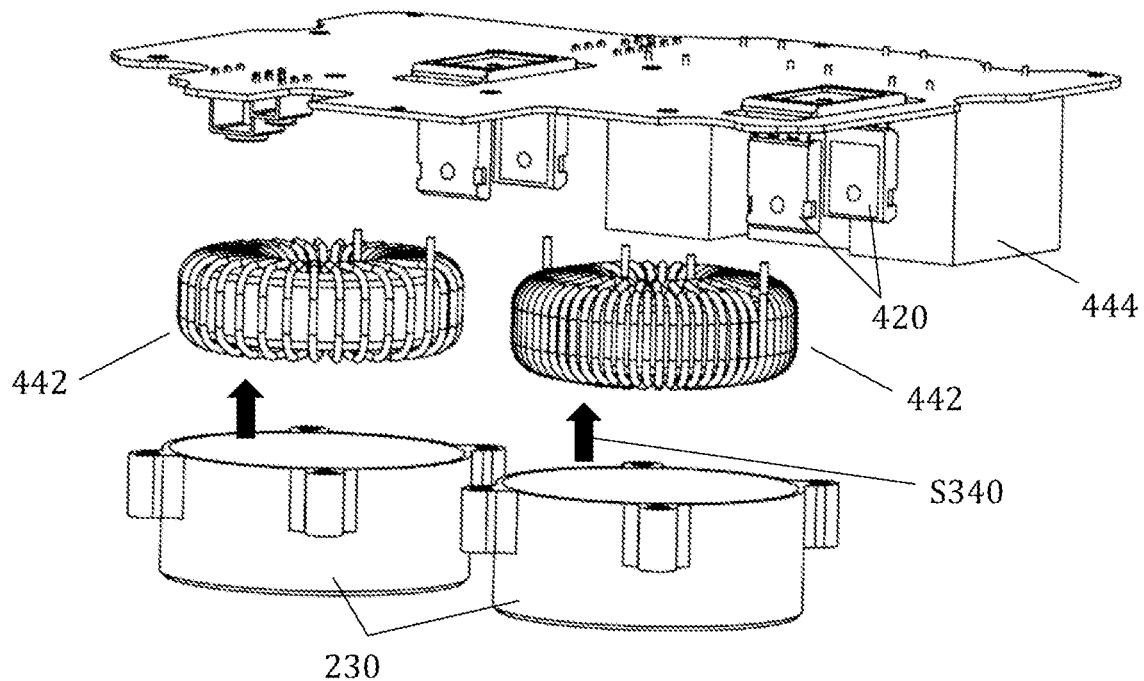
FIG. 10 is a schematic representation of a variation of thermally coupling a cooling receptacle to a passive component.

Alternatively, shown in FIG. 10, the primary power electronic component can be inserted into the cooling receptacle after the power electronic component is mounted to the circuit board. The circuit board can be inverted over an encapsulation compound-filled cooling receptacle with the power electronic component aligned with the opening of the cooling receptacle, wherein the cooling receptacle is subsequently mounted to the circuit board. Alternatively, the cooling receptacle can be inverted over the primary power electronic component, mounted to the circuit board, and have encapsulation compound introduced therein. The cooling receptacle is preferably coupled to the circuit board by screws, adhesive, clips, or any other suitable coupling means.

In one variation of this alternative, the cooling receptacle can be pre-assembled into the case body, wherein circuit board coupling to the case body simultaneously aligns and inserts the magnetic device into their respective cooling receptacles. Pre-assembly of the cooling receptacle within the case body can include applying a thermal interface between the flat face of the cooling receptacle and the cooling plate broad face and aligning the cooling receptacle within the case body. Applying a thermal interface can include adhering a conductive pad or foam to the cooling receptacle face, applying a layer of thermal grease to the cooling receptacle face and/or cooling plate, bonding a metal plate to the cup face and/or cooling plate, or any other suitable method of applying a thermal interface between the two elements. Aligning the cooling receptacle can include inserting the cooling receptacle between adjacent cooling blocks, wherein the concave surfaces of the cooling blocks function to align the cooling receptacle. Alternatively, alignment can include sliding the cooling receptacle against the cooling block, wherein the concave surface of the adjacent cooling block functions to align the cooling receptacle. Alignment can alternatively include orienting the cooling receptacle within an alignment groove in the broad face of the cooling plate. However, any other suitable alignment method can be used. Alignment can be unnecessary if the cooling receptacle is manufactured as a single piece with the case body.

Thermally coupling a cooling receptacle to a primary power electronic component S340 can alternatively include inserting the cooling receptacle through the center/core of the power electronic component (e.g., magnetic device), wherein the cooling receptacle is a thermally conductive rod. The rod is preferably manufactured as a singular piece with the case body, wherein circuit board coupling thermally couples the rod with the magnetic device. Alignment of the rod with the magnetic device can additionally function to assist in circuit board-case body alignment.

Component thermal coupling to the circuit board S300 preferably additionally includes thermally coupling an energy storage component to the cooling channel S360. Circuit board coupling to the case body preferably also couples the capacitor to the cooling channel, wherein a surface of the capacitor substantially contacts the cooling plate broad face, either directly or through a thermal interface. The capacitor can be also be coupled to the cooling channel by coupling the first lid to the case body, wherein a surface of the capacitor substantially contacts the interior face of first lid. As the first lid defines a portion of the cooling channel, the first lid can conduct heat away from the capacitor to the cooling channel. The capacitor can also be coupled to a cooling block with a clip after circuit board coupling to the case body.

Thermally coupling a capacitor to the cooling channel can additionally include applying a thermal interface between the capacitor and the capacitor thermal path. The thermal interface is preferably applied (e.g., adhered, spread, etc.) to the capacitor surface to contact the thermal path. Alternatively, the thermal interface is applied to the portion of the thermal path configured to contact the capacitor (e.g., first lid, cooling plate, etc.). However, no thermal interface can be applied.

Component thermal coupling to the circuit board S300 can additionally include filling the lumen defined by the case body containing the components with an electrically insulative, thermally conductive fluid. Filling the lumen can additionally include the utilization of a fluid displacer (e.g., pump, fan, etc.) that functions to move the thermally conductive fluid within the case body (e.g., cooling via convection).

Introduction of the thermally conductive fluid preferably occurs after the first lid has been coupled to the case body, but before the circuit board has been coupled to the case body.

Coupling the first lid to the case body S400 functions to define the cooling channel and to at least partially seal the case. The first lid can be coupled to the case body at any point in the assembly process. The first lid is preferably screwed to the case, but can alternatively be clipped, adhered, or otherwise coupled to the case body.

Coupling the second lid to the case body S500 functions to at least partially seal the case and to protect the circuit board from physical damage. The second lid is preferably coupled over the circuit board to the case, such that the circuit board is constrained between the second lid and the case body. The second lid is preferably coupled to the case body after the circuit board is coupled to the case body. The second lid is preferably screwed to the case, but can alternatively be clipped, adhered, or otherwise coupled to the case body.

The assembly process can additionally include connecting the connectors to the circuit board. The connectors are preferably connected to the circuit board after the circuit board is mounted to the case body, but before the first lid is mounted against the case body. Connecting the connectors to the circuit board preferably includes inserting the connector leads from the casing body exterior, through the connector ports, to the casing body interior and connecting the connector leads to the circuit board. Inserting the connector leads from the casing exterior can be performed prior to circuit board mounting to the case body, or can be performed after. Connecting the connector leads to the circuit board can include guiding the connector leads through the first access gap and connecting the leads to the circuit board, or can include extending a coupling mechanism (e.g. a finger, a guide, etc.) through the first access gap, coupling to the lead, and guiding the lead to connect with the connector pins on the circuit board.

The assembly process can additionally include inserting cooling feature inserts. Inserting cooling feature inserts can be desirable if the case body does not include cooling features after manufacture. Inserting cooling feature inserts preferably includes aligning and fastening a cooling feature insert against the cooling plate, and is preferably performed before coupling the first lid to the case body. This step can additionally include applying a thermal interface to the portion of the cooling feature insert that contacts the broad face of the cooling plate.

As a person skilled in the art will recognize from the previous detailed description and from the figures and claims, modifications and changes can be made to the preferred embodiments of the invention without departing from the scope of this invention defined in the following claims.

We claim:

1. A power electronic system, comprising:
    a casing comprising:
        a case body comprising: a cooling channel region partially defining a cooling channel, the cooling channel region comprising: a cooling plate having a first and a second opposing broad face, the first broad face adjacent the cooling channel, cooling features extending from the first broad face of the cooling plate, and a cooling block extending from the second broad face of the cooling plate, the case body further comprising a first access gap defined through the case body;
        a first lid that mounts to the case body proximal the first broad face of the cooling plate and cooperatively defines the cooling channel with the case body;
        a second lid that mounts to the case body proximal the second broad face of the cooling plate;
        a coolant inlet and a coolant outlet fluidly connected to the cooling channel;
    a circuit board having a first and a second broad face, wherein the first broad face of the circuit board is mounted to the case body proximal the second broad face of the cooling plate between the case body and the second lid;
    a primary electronic component mounted to the first broad face of the circuit board;
    a cooling receptacle cooperatively enclosing the passive electronic component with the first broad face of the circuit board, the cooling receptacle thermally connected to the second broad face of the cooling plate;
    a secondary electronic component mounted to the first broad face of the circuit board, the secondary electric component thermally connected to the cooling block along a first broad face of the secondary electronic component; and
    a retention mechanism extending through a circuit board thickness from the second broad face of the circuit board to bias the secondary electronic component against the cooling block.

2. The system of claim 1, wherein the case body further comprises a second access gap defined through the case body.

3. The system of claim 2, wherein the cooling channel region is located between the first and second access gaps in the case body, wherein the cooling channel region, first access gap, and second access gap comprise a first, second, and third longitudinal axis, respectively, wherein the cooling channel region, first access gap, and second access gap are aligned with the first, second, and third longitudinal axis parallel to a longitudinal axis of the case body.

4. The system of claim 2, further comprising a second primary component mounted to the first broad face of the circuit board, wherein the second primary component extends through the second access gap and thermally connects to the first lid.

5. The system of claim 1, wherein the circuit board comprises a connector pin mounted to the first face of the circuit board, wherein the connector pin is aligned with the first access gap.

6. The system of claim 5, wherein the system further comprises a connector that extends from a casing exterior through the first access gap to connect to the connector pin.

7. The system of claim 6, wherein the connector extends from a casing wall of the case body that defines the first access gap and the coolant inlet and the coolant outlet extend from the case body adjacent the connector.

8. The system of claim 1, further comprising a thermally conductive potting compound surrounding the primary electronic component within the cooling receptacle.

9. The system of claim 1, wherein the cooling features comprise a plurality of fins extending longitudinally along the cooling channel.

10. The system of claim 1, wherein the first broad face of the secondary electronic component comprises a thermal interface thermally connecting the secondary electronic component to the cooling block.

11. The system of claim 1, wherein the cooling receptacle comprises a thermal interface thermally connecting the cooling receptacle to the second broad face of the cooling plate.

12. The system of claim 1, wherein the retention mechanism comprises a clip comprising two tines connected by an intermediary section, wherein the two tines extend through a first and second hole in the circuit board and the intermediary section is braced against the second broad face of the circuit board.

13. The system of claim 12, further comprising a clip insulator between the intermediary section and the second broad face of the circuit board.

14. The system of claim 12, wherein the system further comprises a second secondary electronic component, wherein the first tine biases the first secondary electronic component against a first broad face of the cooling block and the second tine biases the second secondary electronic component against a second broad face of the cooling block, the first broad face of the cooling block opposing the second broad face of the cooling block.

15. The system of claim 1, wherein the cooling block has substantially constant thickness in a dimension parallel to the cooling plate.

16. The system of claim 15, wherein the cooling block comprises a first and a second broad face, the first broad face of the cooling block opposing the second broad face of the cooling block, and a first and a second convex face connecting the first and second broad faces of the cooling block.

17. The system of claim 1, wherein the system further comprises a second secondary electronic component opposing the first secondary electronic component across the cooling block, wherein a first and second lateral axis of the first and second secondary electronic components, respectively, are aligned substantially equidistant and parallel to a longitudinal axis of the primary component, wherein the longitudinal axis of the primary component is substantially parallel to a longitudinal axis of the cooling channel.

18. The system of claim 1, wherein the secondary electronic component comprises an active electronic component, and the primary electronic component comprises a passive electronic component.

19. A power electronic system, comprising:
a casing comprising:
  a case body defining: a cooling channel encapsulating a plurality of cooling features extending from a first broad face of a cooling plate and a cooling block extending from a second broad face of the cooling plate, the second broad face opposing the first broad face, a first access gap, defined through a case body thickness, having a first and second opening, and a second access gap, defined through the case body thickness, having a first and second opening;
  a first lid that mounts to the case body and seals the second openings of the first and second access gaps, the first lid thermally connected to the cooling channel;
  a second lid that mounts to the case body proximal the first openings of the first and second access gaps;
a circuit board having a first and a second broad face, the circuit board mounted between the case body and the second lid with the first broad face of the circuit board mounted to the case body, the circuit board extending over the cooling channel, first access gap, and second access gap, the circuit board comprising:
  a connector pin mounted to the first broad face of the circuit board, the connector pin aligned with the first access gap;
  an active electronic component mounted to the first broad face of the circuit board, the active electronic component thermally connected to the cooling block;
  a passive electronic component mounted to the first broad face of the circuit board, the passive electronic component aligned with the second access gap; and
a connector that extends from an exterior of a case body wall defining the first access gap through the first access gap and connects to the connector pin.

20. The system of claim 19, wherein the cooling channel is cooperatively defined between the case body and the first lid.

21. The system of claim 19, wherein the passive electronic component extends through the second access gap and thermally couples to the first lid.

22. The system of claim 19, further comprising a clip extending through the circuit board from the second broad face that retains a broad face of the active electronic component against a broad face of the cooling block.

23. The system of claim 19, further comprising a cooling receptacle encapsulating a second passive electronic component, wherein the cooling receptacle is mounted to the first broad face of the circuit board and thermally connects to the second broad face of the cooling plate.

24. The system of claim 23, further comprising a second cooling receptacle encapsulating a third passive electronic component mounted to the first broad face of the circuit board; a second, third, and fourth active electronic component mounted to the first broad face of the circuit board; and a second cooling block extending from the second broad face of the cooling plate; wherein the first active electronic component opposes the second active electronic component across the first cooling block and the third active electronic component opposes the fourth active electronic component across the second cooling block, wherein a lateral axis of the first active electronic component is aligned with a lateral axis of the third active electronic component and a lateral axis of the second active electronic component is aligned with a lateral axis of the fourth active electronic component, wherein the lateral axes of the first, second, third, and fourth active electronic components are substantially parallel and equidistant to a centerline extending along longitudinal axes of the first and third passive electronic components.

25. The system of claim 24, wherein the second and third passive electronic components comprise magnetic devices and the first passive electronic component comprises an electrical charge storage device.

26. A method of assembling a power electronic system, comprising:
assembling a cooling receptacle encapsulating a primary element encased within a potting compound to a first broad face of a circuit board;
assembling a secondary electronic component to the first broad face of the circuit board at an angle to a normal vector to the first broad face of the circuit board;
mounting the first broad face of the circuit board to a first side of a case body, the case body comprising: a cooling channel comprising a plurality of cooling features, the cooling channel defined on a second side of the case body opposing the first side, a cooling block extending from the first side of from the first side to the second side of the case body, the first access gap adjacent the cooling channel along a case body width, and a second access gap extending from the first side to the second side of the case body, the second access gap opposing the first access gap across the cooling channel;
inserting a retention mechanism from a second face of the circuit board, through the circuit board, to the first face of the circuit board to bias and thermally connect the secondary electronic component against the cooling block;
mounting a second lid to the first side of the case body and encapsulating the circuit board between the second lid and the case body;
connecting a connector from an exterior of the case body to the circuit board through the second access gap; and mounting a first lid to the second side of the case body to seal an end of the first and second access gaps.

27. The method of claim 25, further comprising fluidly connecting the cooling channel to a coolant source.

* * * * *